United States Patent

Massoumi et al.

[11] Patent Number: 6,115,300
[45] Date of Patent: Sep. 5, 2000

[54] COLUMN REDUNDANCY BASED ON COLUMN SLICES

[75] Inventors: Ali Massoumi, Moran Hill; Hing Wong, Los Altos, both of Calif.

[73] Assignee: Silicon Access Technology, Inc., San Jose, Calif.

[21] Appl. No.: 09/186,215

[22] Filed: Nov. 3, 1998

[51] Int. Cl.[7] .................................................. G11C 7/00
[52] U.S. Cl. ...................................... 365/200; 365/230.03
[58] Field of Search .................................... 365/200, 201, 365/230.03

[56] References Cited

U.S. PATENT DOCUMENTS

| | | | |
|---|---|---|---|
| 4,462,091 | 7/1984 | Krepper et al. | 365/200 |
| 5,502,675 | 3/1996 | Kohno et al. | 365/200 |
| 5,548,553 | 8/1996 | Cooper et al. | 365/200 |
| 5,579,256 | 11/1996 | Kajigaya et al. | 365/51 |
| 5,602,771 | 2/1997 | Kajigaya et al. | 365/200 |
| 5,742,556 | 4/1998 | Tavrow et al. | 365/225.7 |
| 5,796,662 | 8/1998 | Kalter et al. | 365/200 |

*Primary Examiner*—Viet Q. Nguyen
*Attorney, Agent, or Firm*—Fernandez & Associates, LLP

[57] ABSTRACT

DRAM with column slices improves circuit redundancy. Slices have global column length, and memory is divided in groups with size of redundancy columns having slices. Failure detected among slices of corresponding storage is replaced by corresponding redundancy column slice, such that column redundancy division is in vertical column direction. Column includes global data line shared by column slices and multiple blocks. Redundant column is added to memory array, and redundant control circuits or comparator are proximate to data sense amplifiers. Defective column address are provided to controller through non-volatile memory, or laser-blown or electrically-programmable fuses. When column address is presented, incoming address is compared with stored address, such that select data is output on redundant data line when equal addresses (i.e., hit detect), or normal data is output when unequal addresses (i.e., "miss" detected).

18 Claims, 4 Drawing Sheets

COLUMN REDUNDANCY BASED ON COLUMN SLICES

FIELD OF INVENTION

Invention relates to electronic memory circuits, particularly to dynamic random access memory (DRAM) having redundant columns.

BACKGROUND OF INVENTION

DRAM circuits are typically arranged in accessible rows, columns, and associated control, access or timing logic. Furthermore, since such memory circuits are relatively densely designed in silicon active area, and therefore susceptible to manufacturing defects, redundant circuitry is sometimes provided with conventional DRAMs. Such built-in redundancy allows DRAM manufacturers to test for certain circuit defects, such as column shorts arising from wafer fabrication, and thereby enabling limited circuit reconfiguration around known faulty circuit portions.

Prior-art approach to providing column redundancy with memory circuits is shown in FIG. 1. Here, global column redundancy serves multiple memory blocks, wherein redundant column are sub-divided in multiple segments, each corresponding to memory block or group of blocks. As shown, column redundancy is divided in segments A–D, and each redundant segment has its own controller and corresponds to specific memory block. In simplified implementation of such scheme, global column may be a single segment.

Although such approach serves to replace four independent defects, corresponding to each block, significant prior-art shortcomings include:

(1) Non-Scalability. Each redundancy control circuit is hardwired to a block. If number of blocks is variable, separate circuit design has to be implemented for each situation.

(2) Limited Efficiency. Not efficient when number of blocks is less than number of redundancy control circuits. Also, not efficient in fixing global column fails. To fix single global column fail, all redundant segments are needed.

(3) Row-Address Decoding. Row address is needed to decode column redundancy, thereby resulting in column path delay, particularly with multiple bank memories.

SUMMARY OF INVENTION

Invention resides in digital storage device, such as DRAM integrated circuit, with column circuit divided in slices. Each slice has global column length and controlled by controller. Preferably, storage is divided in groups with size of redundancy columns having slices. Failure detected among slices of corresponding storage is replaced by corresponding redundancy column slice (i.e., division of column redundancy is in column direction, instead row direction). Alternatively, multiple redundant columns may be implemented. Additionally, in manufacturing process, present redundancy architecture serves to repair defective memory.

In particular, column may include global data line shared by column slices, such global data line being shared further by multiple blocks. Redundant column is added to memory array, and redundant control circuits provided relatively adjacent to data sense amplifiers. Such redundancy controller functions substantially as comparator. When enabled, defective column address may be provided to controller, such as through non-volatile memory, laser blown fuses, or electrically programmable fuses. Furthermore, when column address is presented to controller, incoming address may be compared with stored address, such that when such addresses are determined to be equal (i.e., "hit" detected), data on redundant data line is selected for output, but when determined to be unequal (i.e., "miss" detected), normal data is provided.

During write operation, when hit is detected, normal data is selected to be driven on redundant data line and written in redundant memory cells. If miss is detected, then data may be written on normal data line, and then on normal memory cells.

In accordance with contemplated advantages and objectives of present invention, column short may be corrected effectively at arbitrary location using single redundancy column. Further, scaleable methodology and architecture is enabled since same circuit implementation applies to circuit designs with arbitrary number of memory blocks, particularly embedded functions using variable-size memories. Additionally, present approach is more efficient for handling circuit designs when block number is less than number of possible redundancy groups, particularly since all fuse groups are effective in present approach regardless of memory block number. Furthermore, present approach replaces more fails running through multiple blocks, as well as provides improved performance, since no row address are generated for column redundancy compare.

DETAILED DESCRIPTION OF PREFERRED EMBODIMENT(S)

Figure 1:
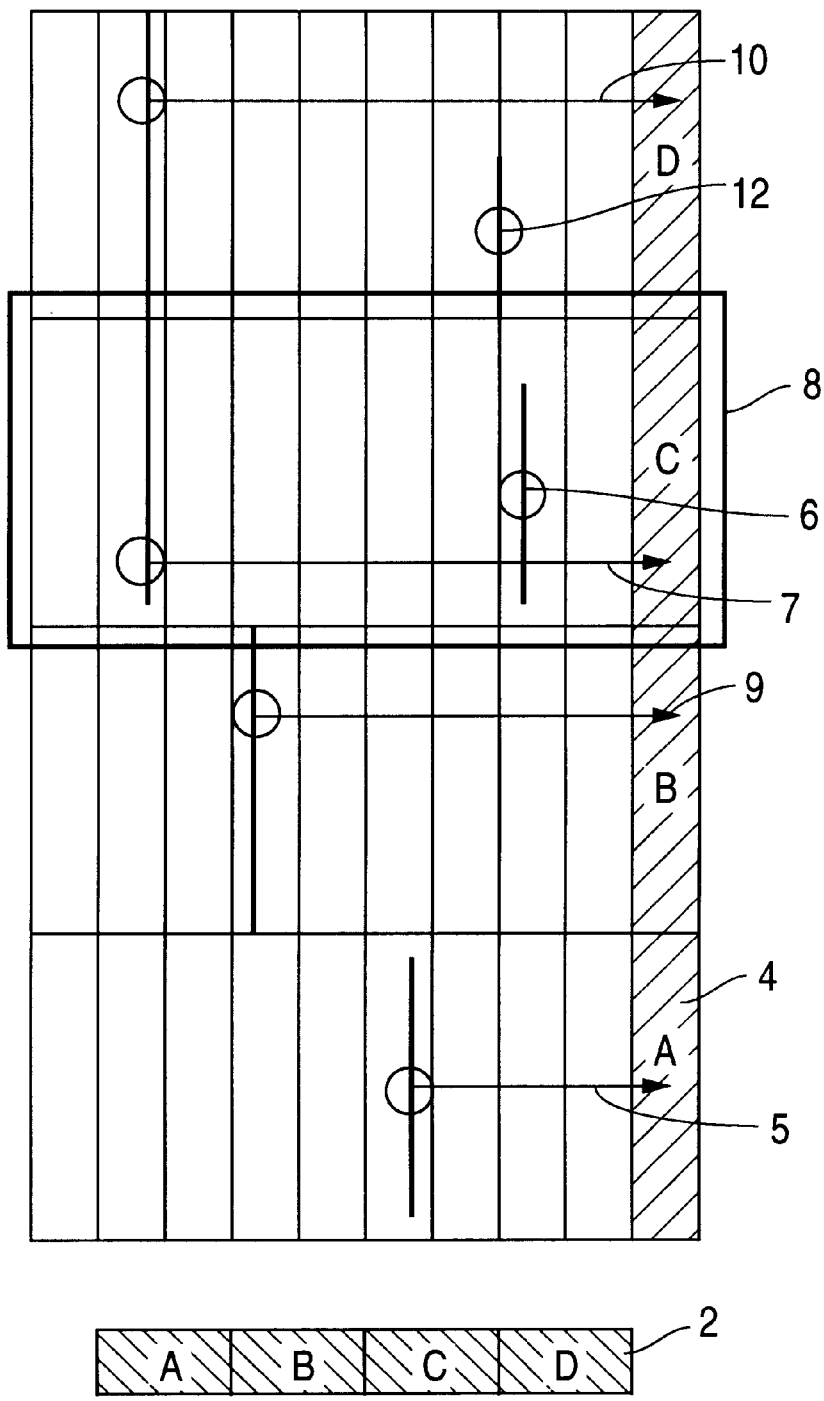
FIG. 1 is memory circuit diagram of prior-art column redundancy.

Preferred embodiment is method and/or associated apparatus arising in one or more digital storage or memory device and/or associated firmware or software, such as DRAM or functionally equivalent integrated circuit, system or board, particularly having column and/or row slice divisions to provide circuit redundancy. As defined herein, term "slice" is understood broadly or expansively to mean or refer generally to any one or more linearly aligned circuit structure or design definition representative thereof.

Generally, each circuit vertical column (or horizontal row) slice has global length and is controlled by processor or controller circuit coupled functionally thereto. Memory storage is divided or designated preferably in groups or other equivalent association as specified with redundancy sizes having certain number of slices. Memory circuit which is failure tested or detected in column (or row) slices of corresponding storage is replaced or electrically or logically reconfigured by corresponding redundancy slice, whereby division of circuit redundancy is in column (or row) direction.

Preferably, multiple redundant columns are implemented by physical and functional placement on one or more device substrate or system board, software representation or simulated modeling or emulation thereof, for appropriate memory circuit design, such that during subsequent device or semiconductor wafer fabrication, manufacturing, and testing, redundant column architecture offers reparability of or reconfigurability to avoid defective column circuits in electronic memory. In particular, subject column includes global data line shared by column slices; such global data line may also be shared by multiple blocks. Redundant column is included or added to memory array or system or circuit design incorporating thereof, and redundant control circuits provide or placed relatively adjacent or proximate to data sense amplifiers coupled thereto. Redundancy controller serves substantially as comparator logic function.

Upon being enabled or electronically activated, one or more defective or otherwise identified column address or other accessible location may be provided to controller through combinatorial logic or equivalent reconfigurable storage repository, such as through non-volatile memory, laser-blown fuses, or electrically-programmable fuses. Also, when such column address is presented to controller, incoming address or other accessible location is compared with such stored address, so that when such addresses are determined by comparator function or controller operation to be substantially equal, thereby identifying "hit" detection, data on redundant data line may be selected for output. However, when such addresses are determined accordingly to be unequal, thereby identifying "miss" detection, then normal data is provided as output therefrom.

Additionally, during write, read or other functionally comparable memory-access operation, when so-called hit condition is detected, normal data is selected to be driven on redundant data line and written in redundant memory cells, while no write or other operation occurs for normal column. But, when so-called miss condition is detected, then data is written on normal data line, and then on normal memory cells.

Hence, pursuant to present inventive process and/or system, digital storage or memory array column or row short or other such testable defect may be corrected or otherwise re-configured logically around effectively at arbitrary location using single redundancy column or row. Furthermore, scaleable or expandable methodology and architecture is enabled flexibly, since substantially same-circuit, modular, or building-block implementation is portable or applies to circuit or system designs having variable-sized or otherwise arbitrary number of memory blocks, particularly for so-called embedded functions often using various memories sizes or storage configurations.

Additionally, present redundant-slice approach is more efficient for handling memory circuit designs when block number is less than number of possible redundancy groups, particularly since substantially all fuse or other field-reconfigurable logic groups used therewith are effective in present approach, regardless of memory block number. Furthermore, present approach advantageously replaces more fails or other recognized column or row circuit faults running through or associated with multiple or neighboring blocks, as well as provides further improved performance, because no row or column address are necessarily generated respectively for row or column redundancy compares.

Referring back to prior-art diagram in FIG. 1, conventional block-based column redundancy is shown, whereby redundant column of each block is controlled by its own fuse group. Unlike with slice-based column redundancy approach of present invention, each block can have one fail, assuming that there is one redundant column provided. As shown, block-based redundant column 4 is provided with one fuse group 2 associated with one block, particularly illustrating various possible column replacements candidates 10 and 12 (in block D), 6 and 7 (in block C 8), 9 (in block B), and 5 (in block A). However, due to prior-art shortcoming of being able to treat single defect per block, such multiple defects are thus not completely fixable (e.g., when there is one redundant column, fail detect occurring across address boundary between two columns cannot be fixed.)

Figure 2:
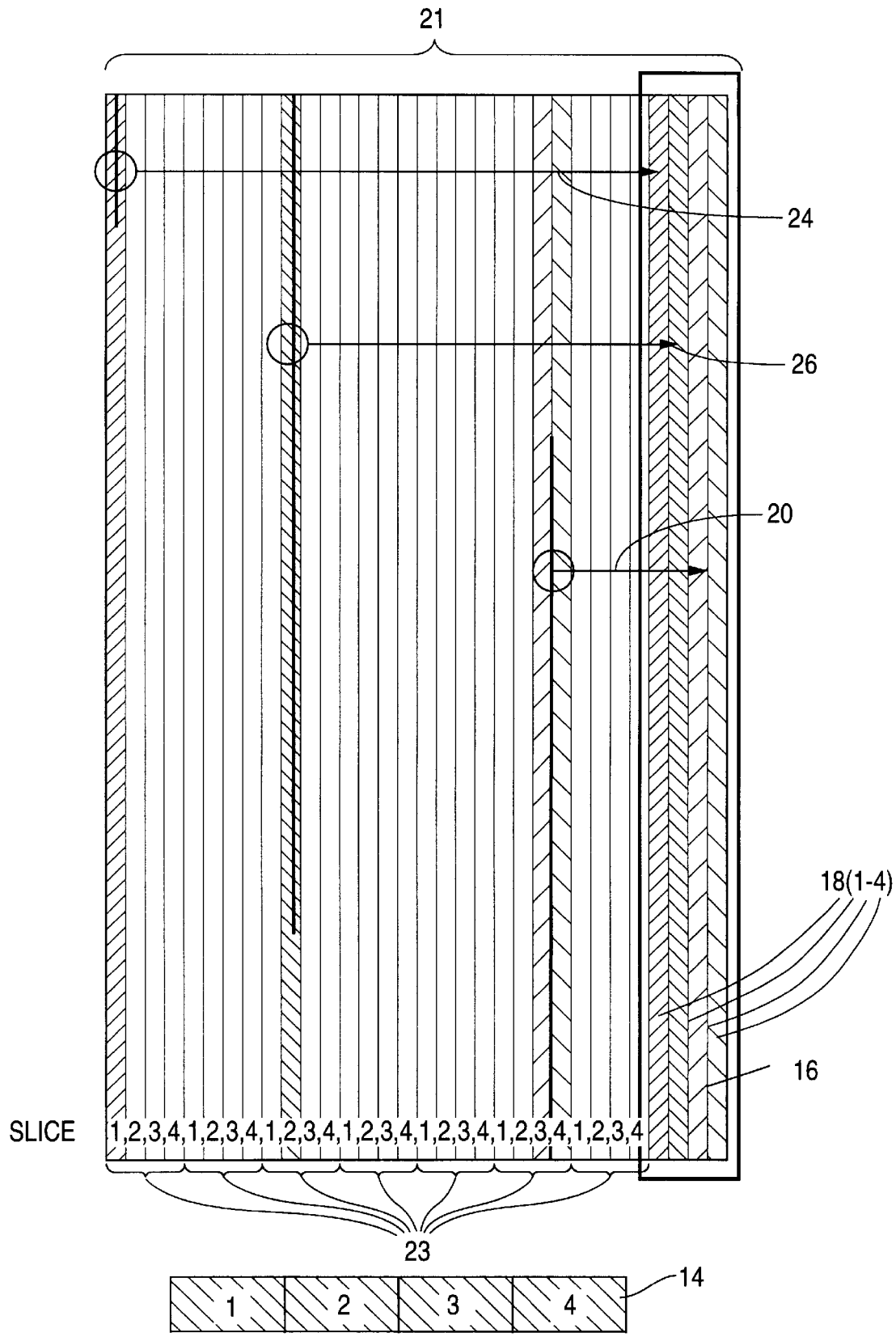
FIGS. 2–3 are memory circuit diagrams of present invention.

Referring now to FIG. 2 diagram of preferred implementation showing DRAM or other functionally equivalent storage or memory array 21 with columns (or row) 23 having column (or row) redundancy based on vertical column (or horizontal row) slices, redundant column 16 is divided into multiple independent slices (e.g., 4) 18(1–4). Entire memory array 21 is divided or partitioned into groups 23 that are correspondingly numbered in sequential independent slices and have substantially same size as redundancy columns 16 with multiple slices 18(1–4) within. Thus, any recognized column (or row) fail or defect otherwise tested among slices of same corresponding slice number can be replaced individually by corresponding available redundancy column slice.

As shown, for example, normal slice designated number 1 is replaceable 24 with redundant column slice number 1, normal slice designated number 2 is replaceable 26 with redundant column slice number 2, normal slice designated number 3,4 (i.e., third slice in fourth group) is replaceable 20 with redundant column slice number 3,4. Hence, in this slice-level granularity of circuit redundancy, even when there is only one redundant column 16, given fail across address boundary may still be fixed. Furthermore, as shown, one redundancy controller 14 is associated correspondingly with one slice.

Figure 3:
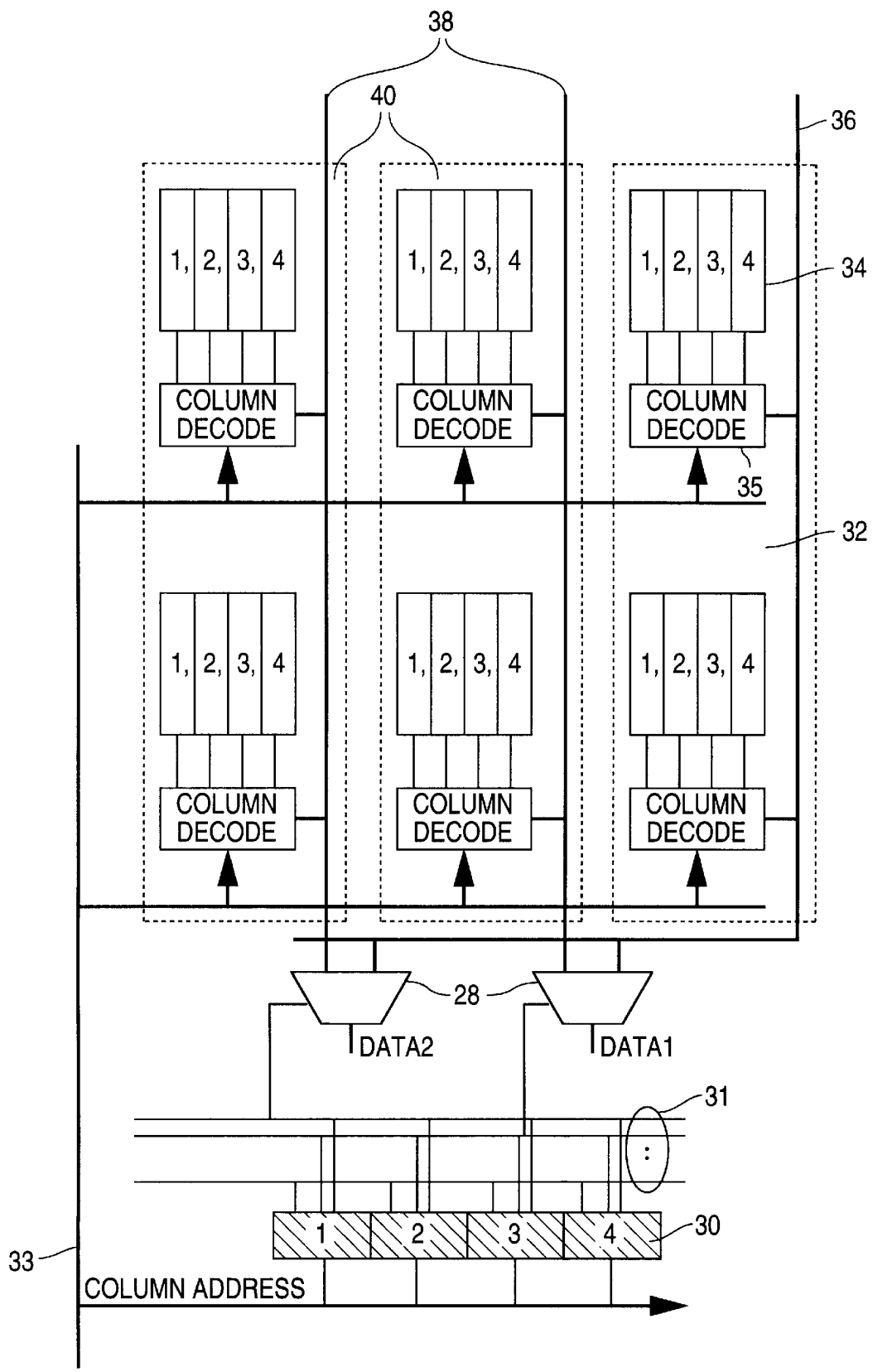

In FIG. 3 diagram, more detail of preferred sliced-based column redundancy DRAM circuit is shown (only read path for simplicity). Normal columns 40 and redundant column 32 each include column slices 34 having column decode 35 coupled to four separate slices included therein.

Multiplexer or other functionally equivalent read access control logic and/or sense amplifier 28 receive redundant data line or bus signal 36 and normal or global data line or bus signal 38 for selective data output generation. In particular, such redundant memory circuit access scheme serves to multiplex selectively between normal or redundancy data, depending on whether redundancy indicator or functionally equivalent processing or computing electronics 30 detects or otherwise determines that certain one or more accessed (e.g., read or write) memory cell row and/or column is defective or otherwise fails to meet specified manufacturing or testing criteria.

Redundancy controller 30 is provided effectively per slice and accordingly couples to various column decode 35 through column address lines or bus 33 and to various multiplexers/sense amps 28 through redundancy select lines or bus 31.

Figure 4:
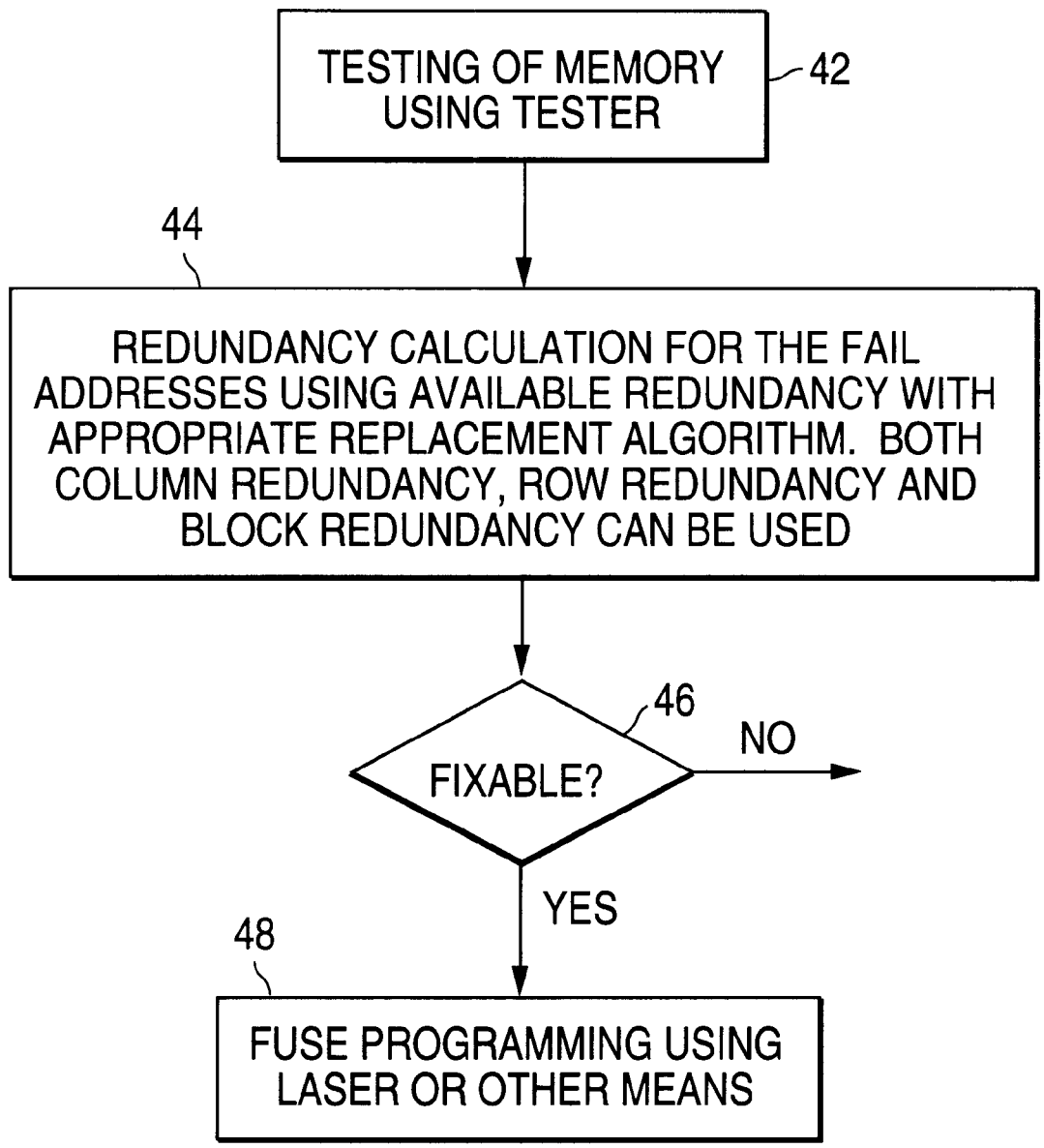
FIG. 4 is flow chart of manufacturing steps implementing present invention.

FIG. 4 flow chart illustrates manufacturing flow to test and repair subject memory circuit using present slice-based column and/or row redundancy circuit correction algorithm and implementation thereof. Initially, subject circuit design is tested 42, for example, through conventional semiconductor wafer or functionally equivalent device test equipment and associated firmware and software.

Then, redundancy calculation or effective logical equivalent 44 of memory cell or subject column and/or row circuit fail or defect addresses are detected, indicated and otherwise logged, using available redundancy provided in presently modified DRAM device with appropriate defective-circuit replacement or reconfiguration algorithm. Column, row, and/or block redundancy can be used as generally described herein.

If subject column, row, or block memory circuit or cell is deemed 46 non-fixable (e.g., no unused or available redundancy circuit in corresponding slice number, or other unclassified non-fixable circuit condition), then subject circuit is altogether discarded. Otherwise, if redundancy determination deems subject circuit to be fixable, then DRAM circuit is fixed, reconfigured, or otherwise electrically programmed so as to direct read and/or write access away from defective column and/or row slice to functional non-defective corresponding slice in available redundant circuit now coupled thereto. Post-manufacturing or field reconfiguration may be accomplished using electrical fuse interconnect, laser or other equivalent programming repair scheme.

In alternate embodiment, electronic design automation (EDA) system implemented in conventional engineering workstation or other computing platform having operating system, and design and/or verification software-implemented engineering tools for circuit and/or system definition and simulation, provides computer-assisted facility to generate various memory circuits or electronic file representation thereof having redundant slice columns and/or rows and associated controller and programmable interconnect, as described herein.

Preferably, EDA tool provides synthesis (e.g., so-called Verilog, VHDL, or other substantially compatible format), schematic capture (e.g., so-called EDIF, or other substantially compatible format), register transfer level (RTL or other substantially compatible format), or other automated electronic tool to generate one or more file representation of user-specified or desired prototype, circuit, system or board. Such functional definition, which includes at least one memory slice structure and associated redundancy, control, and reconfigurability functions as described herein, may then be provided to EDA tool suite for further processing, such as simulation or physical placement thereof.

For example, generated prototype DRAM may include column circuit divided in slices, as shown above in FIGS. 2–3. Accordingly, each slice has global column length and controlled by controller, wherein memory design is divided in groups with size of redundancy columns having slices. Moreover, memory cell failure is detectable among slices of corresponding storage for replacement by corresponding redundancy column slice. Thus, column and/or row short may be repaired at arbitrary location using single redundancy column and/or row. Such design approach is provided by same-circuit building block which may be used for circuit designs with arbitrary number of memory blocks, such as embedded controllers with various storage requirements.

Foregoing described embodiments of the invention are provided as illustrations and descriptions. They are not intended to limit the invention to precise form described. In particular, Applicant(s) contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by claims following.

What is claimed is:

1. A circuit comprising:
   a memory circuit divided into one or more groups, each group having a first slice and a second slice; and
   at least one redundancy group, coupled to the memory circuit, having a first slice and a second slice, anyone of a first slice in the one or more groups in the memory circuit being replaceable with the first slice of the at least one redundancy group.

2. The circuit of claim 1 wherein: the at least one redundancy group comprises at least one row redundancy.

3. The circuit of claim 1 wherein: the at least one redundancy group comprises at least one column redundancy.

4. The circuit of claim 1 wherein: the first slice in the one or more groups in the memory circuit is defective; and wherein a controller identifies the defective first slice in the one or more groups in the memory circuit according to a signal from a tester coupled to the memory circuit.

5. The circuit of claim 4 wherein:
   the controller identifies each defective slice according to a signal stored in a programmable storage element which is programmed based on a memory test result or a redundant element availability.

6. The circuit of claim 5 wherein:
   the programmable storage element comprises a fuse or an electrically programmable memory.

7. The circuit of claim 4 wherein:
   the controller determines an available redundant circuit corresponding to an identified defective slice.

8. The circuit of claim 1 wherein:
   each group in the one or more groups of the memory circuit comprises a third slice and a fourth slice.

9. The circuit of claim 1 wherein: the first slice of the one or more groups corresponding to a first address; and the second slice of the one or more groups corresponding to a second address wherein the first and second addresses of the one or more groups are multiplexed.

10. A method for testing a memory circuit, comprising the steps of:
    providing one or more groups in the memory circuit coupled to at least one redundancy group, each group in the one or more groups having a first slice and a second slice, the at least one redundancy group having a first slice and a second slice; and
    detecting a defect in a first slice in the one or more groups, anyone of a first slice in one or more groups in the memory circuit being replaceable with the first slice of the at least one redundancy group.

11. The method of claim 10 wherein:
    the at least one redundancy group comprises at least one row redundancy.

12. The method of claim 10 wherein:
    the at least one redundancy group comprises at least one column redundancy.

13. The method of claim 10 wherein:
    the at least one redundancy group is programmably coupled to an access line.

14. In an electronic design automation system, a process for generating a redundant memory circuit comprising the steps of:
    receiving a first functional representation of a memory circuit comprising a plurality of groups, each group having a first slice and a second slice; and
    generating a second functional representation of the memory circuit comprising at least one redundancy group, the at least one redundancy group having a first slice and a second slice, anyone of a first slice in the plurality of groups being replaceable by the first slice of the at least one redundancy group.

15. The process of claim 14 wherein:

the second functional representation further comprising one or more programmable interconnect for selectably coupling the first and second slices of the at least one redundancy group.

16. The process of claim 14 wherein:

the second functional representation further comprising a controller for determining a defective slice condition in the plurality of groups.

17. The process of claim 16 wherein:

upon determining the defective slice condition, the controller selectably connecting to the first slice in the at least one redundancy group to replace the defective slice in the plurality of groups.

18. The process of claim 14 further comprising the step of providing a global line coupled to a plurality of groups for selective data output generation.

* * * * *